United States Patent
Cheriton et al.

(10) Patent No.: US 11,658,462 B2
(45) Date of Patent: May 23, 2023

(54) INTEGRATED FILTER REMOTE GAS CORRELATION SENSOR

(71) Applicant: National Research Council of Canada, Ottawa (CA)

(72) Inventors: Ross Cheriton, Ottawa (CA); Siegfried Janz, Ottawa (CA); Adam Densmore, Victoria (CA)

(73) Assignee: National Research Council of Canada, Ottawa (CA)

( * ) Notice: Subject to any disclaimer, the term of this patent is extended or adjusted under 35 U.S.C. 154(b) by 396 days.

(21) Appl. No.: 16/879,658

(22) Filed: May 20, 2020

(65) Prior Publication Data

US 2021/0367403 A1 Nov. 25, 2021

(51) Int. Cl.
  *H01S 5/14* (2006.01)
  *H01S 5/026* (2006.01)
  *H01S 5/06* (2006.01)

(52) U.S. Cl.
  CPC ............. *H01S 5/142* (2013.01); *H01S 5/026* (2013.01); *H01S 5/0612* (2013.01)

(58) Field of Classification Search
  CPC ........ H01S 5/142; H01S 5/026; H01S 5/0612; G01N 21/3504; G01N 2021/3509; G01N 2021/3531
  See application file for complete search history.

(56) References Cited

U.S. PATENT DOCUMENTS

| 9,052,291 B2 | 6/2015 | He et al. | |
| 2010/0014094 A1* | 1/2010 | Cole | G01N 21/85 356/519 |
| 2018/0340883 A1* | 11/2018 | Orcutt | G01N 33/0022 |

FOREIGN PATENT DOCUMENTS

CN 103308480 9/2013

OTHER PUBLICATIONS

E. Vargas-Rodriguez, "Optical Gas Sensors Based on Correlation Spectroscopy Using a Fabry-Perot Interferometer", Ph.D. Thesis, University of Southampton, Aug. 2007, pp. 227, Southampton, United Kingdom.
E. Vargas-Rodriguez, "Design of CO, CO2 and CH4 Gas Sensors Based on Correlation Spectroscopy Using a Fabry-Perot Interferometer", Sensors and Actuators B, 2009, pp. 410-419, vol. 137.

* cited by examiner

Primary Examiner — Yuanda Zhang (57) ABSTRACT

An integrated optical sensor enables the detection and identification of one or more remote gases using a transmission filter that matches specific absorption features of a remote gas and is detected using a single photodetection element. The sensor comprises an integrated optical component that is characterized by its transmission spectrum which corresponds to absorption or emission features of a target gas over a defined spectral bandpass, and the ability to have a reversibly tunable transmission spectrum. The change in the optical power output from the sensor as the transmission spectrum is tuned is proportional to the optical depth of the target gas absorption lines when viewed with a background light source. The optical power output from the integrated optical component is therefore related to the absorption spectrum of the input light Physical properties of the sensor are tailored to produce a quasi-periodic transmission spectrum that results in a stronger signal contrast for a specific gas. The sensor is preferably a waveguide ring resonator with a free spectral range that matches the absorption spectrum of a gas over a finite spectral bandpass.

19 Claims, 11 Drawing Sheets

INTEGRATED FILTER REMOTE GAS CORRELATION SENSOR

FIELD OF THE INVENTION

The present invention is related to a method and device for remote gas sensing, in particular using an integrated filter such as a ring resonator tailored to match a specific gas spectrum.

BACKGROUND OF THE INVENTION

Absorption spectroscopy is an important tool for the determination of molecular composition where direct interaction with a target gas is not practical or feasible. Typical applications range from the measurement of trace gases in the atmosphere, gas emissions, hyperspectral ground and satellite-based remote sensing platforms, to deep-sky and solar system astronomical spectroscopy. Many other high sensitivity molecular spectroscopy techniques have been pursued using active techniques such as dual comb spectroscopy but these require laser sources, complex electronics and optics, and cannot probe distant targets.

As an example, the compositional analysis of astronomical objects and distant atmospheric targets both must rely on simple absorption spectroscopy with a natural background light source. The background light source can be, for example, the sun, a star, the sky, a light emitting diode (LED) or an incandescent source. From such spectra, many molecular species can be detected and identified by their unique absorption spectrum that results from their vibrational and rotational mode distributions.

Most absorption spectroscopy platforms are built around some form of dispersive spectrometer that disperses the incoming light across a detector array to capture the spectrum, which is subsequently analyzed to extract the molecular absorption features of interest. In astronomy, modern large telescopes must be matched to correspondingly large dispersive spectrometers.

At present, conventional spectroscopic approaches are used that require long telescopic exposure times, large spectrometers and significant post-measurement data processing to extract useful information. Correlation methods to identify molecules can be applied numerically after data is collected, rather than in real time. For very weak signals long exposure time cannot overcome 1/f noise limitations on attainable signal to noise ratio.

Replacing dispersive spectrometers with a compact device that can detect and quantify the presence of a specific target molecule may significantly reduce the size and complexity of such systems in applications where a complete spectrum is not required. Integrated photonic systems allow for the processing of light on the plane of a centimeter sized chip. Silicon photonics is among the most developed of these technologies, with many different types of integrated optical devices having been developed for telecommunications and sensing. Examples include integrated filters, modulators, wavelength (de)multiplexers (i.e. spectrometers), optical switches, phase shifters, and label-free biosensors. Planar waveguide spectrometers can be implemented as echelle gratings, arrayed waveguide gratings, Fourier transform spectrometers, and photonic crystal superprisms on integrated platforms.

Waveguide ring resonators have been used as local gas sensors but these devices rely on detecting the interaction of trace gases with the evanescent field extending outside the single mode waveguides and cannot be used for remote detection.

In the case of remote absorption spectroscopy, the detection of absorption features in the spectrum of the input light is used to infer the presence and type of molecular species lying between a broadband light source and the detector. As molecular species exhibit unique spectral fingerprints in the infrared, this uniqueness can be used to identify the molecule through a correlation of the absorption spectrum with a matching spectral filter, without the need to disperse and acquire a full spectrum. This principle has been demonstrated using bulk optic Fabry-Perot (FP) interferometers to produce a periodic transmission filter that can be correlated with a vibronic gas spectrum over a finite spectral region. The infrared absorption spectrum of many gases exhibit quasi-periodic vibronic absorption features generated by their coupled vibrational and rotational degrees of freedom. While vibronic spectra are not perfectly periodic, the periodicity is sufficient over a finite spectral range to simultaneously overlap numerous transmission lines of a FP interferometer cavity with a suitably chosen cavity length.

Despite the advantages of the conventional technologies described above, these technologies are often bulky, expensive and slow for large scale deployment and usage.

SUMMARY OF THE INVENTION

The invention pertains to an integrated optical waveguide ring resonator on a silicon chip which supports one or more input and output waveguide. The input and output waveguides support the transmission of light on the chip such that light can be coupled into and out of the component. The ring resonator has transmission features at wavelengths that match the absorption or emission spectrum of the target gas that is to be detected over a finite spectral bandpass.

While the previously mentioned work used FP interferometers, waveguide ring resonators can be used for the same purpose since they are analogous to on-chip FP cavities. Silicon waveguide ring resonators are preferable as they are significantly more compact, mechanically stable, lower cost, and can be spectrally tuned at a much higher frequency with low power consumption.

According to one aspect of the invention, the integrated optical component takes the form of an integrated photonics waveguide ring resonator. The round-trip length, material system, and geometry of the integrated photonics waveguide ring resonator can be adjusted such that the transmission spectrum from either a drop port or a through port of a ring matches the spectral line features of the gas.

According to another aspect of the present invention, there is provided an apparatus, comprising: an optical waveguide ring resonator having a waveguide width and height; a well-defined round-trip length that results in a free spectral range matching spacing of spectral features of a remote gas target over a defined bandpass; a bandpass filter; a background light source; a singular or plurality of optical bus waveguides evanescently coupled to the ring resonator; input and output optical channels; an active element which can reversibly tune the effective index of the sensor; and a photodetector.

According to another aspect of the present invention there is provided a method, comprising; providing the ring resonator with a free spectral range that matches the spectral feature spacing of a remote gas target over a defined bandpass.

The chip supports an active mechanism which modifies the effective index of the integrated optical component to alter the transmission spectrum of the integrated optical component. The mechanism may be achieved via heating, Pockels effect, Kerr effect, or free carrier injection. In one aspect of the effective index control, heaters are used to locally heat up all or part of the integrated optical component to achieve the effective index change.

The invention further comprises an optical bandpass filter is used to limit the input spectrum to the integrated optical component.

According to another aspect of the invention, a polarizing filter or beam splitter is used to input a single polarization into a single ring.

The invention further comprises a photodetector to detect light that is output from the output waveguide(s) of the integrated optical component.

The invention further comprises a sufficiently broadband background source which spans the spectral bandwidth of the optical bandpass filter.

The present invention provides the design and characterization of an integrated photonic remote gas sensor using waveguide ring resonators. By actively modulating the ring resonator transmission comb spectrum using an active element while coupling light from the target through the ring, a correlation signal is generated to detect and identify the target gas based on the presence of absorption or emission lines in the incoming broadband light signal. This allows for on-chip detection and identification of remote molecular species without spectrum acquisition using only a single detection channel. Gas specific integrated correlation filters can replace dispersive spectrometers in many targeted remote sensing applications where spectral information is secondary to instrument cost, size and detectivity.

The present invention provides the design and characterization of an integrated photonic remote gas sensor in the near-infrared (NIR) using waveguide ring resonators on a silicon-on-insulator (SOI) platform. The NIR region, in particular the telecommunications C-band (1530 nm to 1565 nm), was selected as integrated optics have been developed around the 1500 nm region.

BRIEF DESCRIPTION OF THE DRAWINGS

FIGS. 3a through 3e show the optimization of the ring resonator length for a given effective index of the ring waveguide mode and correlation signals for a target example gas of hydrogen cyanide (HCN).

FIGS. 4a to d show the silicon ring resonator chip and the experimental setup

FIG. 7 a through f shows the experimental results of the correlation signal from the setup of FIG. 4d.

DETAILED DESCRIPTION OF THE INVENTION

Ring Resonator Operating Characteristics

Figure 1:
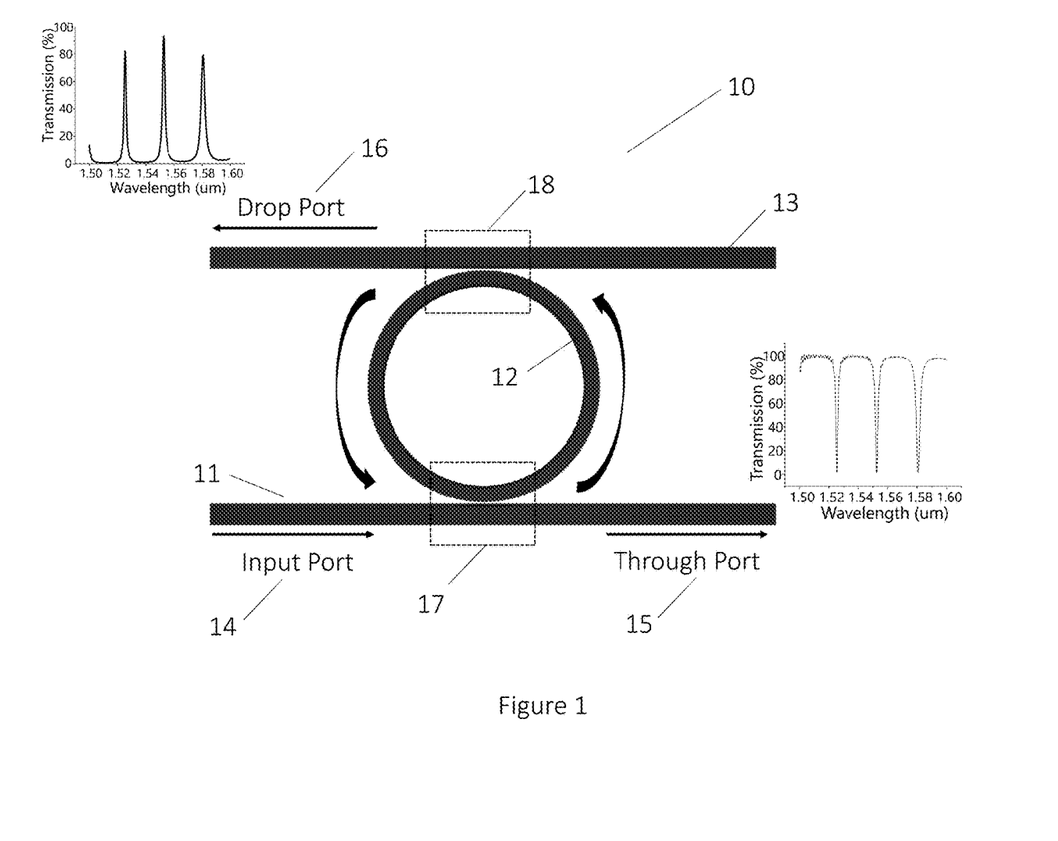
FIG. 1 shows the operation of a ring resonator.

FIG. 1 shows a schematic of an optical ring resonator 10. The optical ring resonator 10 is made up of an input waveguide 11, a ring waveguide 12 and an add/drop waveguide 13. Ring waveguide 12 is not always circular. Oval-shaped waveguides are often used and are also known by the term "racetrack" resonator. The input waveguide 11 is coupled to the ring waveguide 12 at coupling region 17. The coupling of input waveguide 11 to ring waveguide 12 forms a resonant cavity or ring cavity. The ring waveguide 12 is coupled to the add/drop waveguide 13 at coupling region 18. The input waveguide 11 has an input port 14 and a through port 15. The add/drop waveguide 13 has an add port (not shown) and a drop port 16. The add/drop waveguide 13 is also known as a detector waveguide.

When light is input at the input port 14 of input waveguide 11, it is output from the through port 15. However, as the ring waveguide 12 is coupled to the input waveguide 11, some of the light input entering from the input port will be coupled to the ring waveguide 12 due to evanescent field interaction. The light coupled to the ring waveguide is at wavelengths corresponding to the resonance wavelengths $\lambda_m$ of the ring resonator 10. Ring resonators are known to show periodic resonances when light traversing a full round trip of the ring waveguide 12 obtains a phase shift of a multiple of $2\pi$. Due to constructive interference, the light passing through the loop of the ring waveguide 12 will build up in intensity as it passes continuously through the ring waveguide 12. Part of the light passing through ring waveguide 12 is output to the add/drop waveguide 13 where it can be detected at the drop port 16. For constructive interference to occur inside the ring waveguide 12, the circumference of the ring waveguide 12 must be an integer multiple of the wavelength of the light. In other words, the resonance wavelengths $\lambda_m$ of the ring resonator 10 occur under the condition $$\lambda_m = \frac{n_e L}{m}, m = 1, 2, 3 \tag{1}$$

where $n_e$ is the effective index of the waveguide mode, m is the longitudinal mode number, and L is the round-trip length of the ring (circumference of $2\pi r$). The waveguides may support one of or both the transverse electric (TE) and transverse magnetic (TM) modes.

FIG. 1 shows the transmission spectrum of light at through port 15 of the input waveguide 11 for a narrow band of wavelengths. This spectrum shows notches at various points. FIG. 1 also shown the transmission spectrum of light at the drop port 16 of the add/drop waveguide 13. The transmission spectrum of light at the drop port 16 shows transmission regions exactly where the notches occur in the transmission spectrum of light at the through port 15. While the transmission spectrum is shown for a narrow band of wavelengths, this phenomenon of the transmission regions of the spectrum of light at the drop port 16 matching the notches of the transmission spectrum of light at the through port 15 occurs over a broad band of wavelengths. As can be seen the ring resonator 10 acts like a filter and is often used as such.

The inventors of the present invention have realized that the transmission absorption spectrum at the drop port 16 resembles the comb-like absorption spectra of many relevant gases that are sensed for applications such as astronomy, emissions monitoring and agriculture. As such, the inventors realized that the parameters of ring resonators can be tailored very simply for remote gas sensing by using the spectral characteristics of the ring resonator.

The spectral characteristics of interest include the free spectral range (FSR), the finesse (F) and the quality factor Q.

The free spectral range, FSR, is the wavelength spacing between two adjacent resonances. The FSR of a ring resonator is described by:

$$FSR = \frac{\lambda^2}{n_g L}, \quad (2)$$

where $n_g$ is the group index of the waveguide mode.

The finesse, F, is the ratio of the FSR to the full width half maximum (FWHM) of the individual transmission spectrum resonance lines. The FWHM is the width of a resonance peak measured between the points on the y-axis which are half the maximum amplitude. The finesse is a measure of the resonance "sharpness" relative to their spacing. The finesse of a ring resonator is described by:

$$F = \frac{FSR}{FWHM}, \quad (3)$$

The quality factor, Q, characterizes wavelength selectivity of the ring resonator. The quality factor is useful in determining the spectral range of the resonance condition for any given ring resonator. The quality factor is also useful for quantifying the strength of the light coupling into and out of the ring, or the losses in the ring. Another way of describing the quality factor is that it is equal to the number of round trips made by the light in the ring resonator before being completely dissipated through losses or coupling to an output waveguide. The quality factor of a ring resonator is described by:

$$Q = m\frac{FSR}{FWHM} = \frac{\lambda_m}{FWHM}, \quad (4)$$

where m is the resonance index (or the longitudinal mode number as is defined in Equation 1).

Ring Resonator Design and Simulation

Figure 2A:
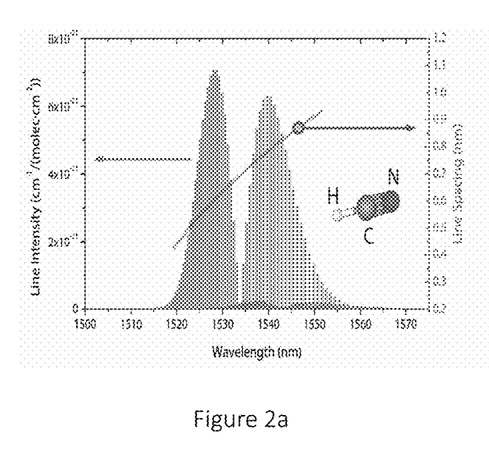
FIGS. 2a and b show the absorption spectrum of hydrogen cyanide (HCN) as an example target gas.
Figure 2B:
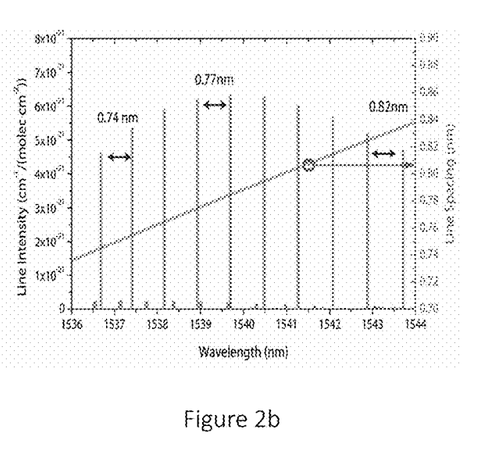

The design and simulation of a ring resonator will now be explained. The inventors started with the absorption spectrum of a known gas. The most abundant isotope, $H^{12}C^{14}N$, of hydrogen cyanide (HCN) gas was chosen due to its importance in astronomical spectroscopy and strong absorption cross-section in the telecommunications C-band, as shown in FIG. 2a. FIG. 2a shows the vibronic overtone absorption spectrum and line spacing as a function of wavelength for the HCN molecule, and FIG. 2b shows a close-up of the absorption lines and corresponding spectral spacing change with wavelength for the HCN Stokes band around 1540 nm. The spacings between adjacent absorption lines of HCN increase approximately linearly with wavelength for the Stokes band.

To achieve the desired FSR of the ring resonator, the ring cavity length (length of the ring waveguide) and the targeted vibronic spectral lines must be chosen carefully to simultaneously match as many ring and gas lines as possible. The optimization of this matching has two primary benefits: a larger possible correlation signal, and molecule specificity.

The HCN vibronic Stokes band centred at $\lambda$=1540 nm was chosen as the target spectral signature since these lines have a lower relative line spacing change with wavelength than the anti-Stokes band at shorter wavelengths, and is therefore more suitable for correlating with the more periodic ring resonator transmission spectrum. Note that both the ring spectrum comb and the vibronic absorption line spacings are not truly periodic and change at different rates with wavelength. The spacing between the strongest HCN absorption lines varies from 0.74 nm to 0.82 nm for the HCN stokes band shown in FIG. 2b. Since the absorption lines at 1540 nm are the strongest in the HCN Stokes band, the inventors chose to target an FSR of approximately 0.77 nm for greater detection sensitivity.

While HCN was selected as the targeted gas, the present invention can be applied to other gases such as carbon monoxide, carbon dioxide, nitric oxide, nitrous oxide, and hydrogen sulfide. The present invention can apply to any gases which have quasi-periodic absorption features that are fairly equally spaced even if it is just a narrow band of wavelengths. The ring resonator transmission spectrum can match one or more spectral features of at least one gas.

The fabrication of the ring resonator will be explained further below. For the design, a single-mode silicon strip waveguide with a height of 220 nm and width of 450 nm was selected. The mode properties were calculated as a function of wavelength and temperature based on an empirical model using a finite difference eigenmode solver (e.g. Lumerical Mode Solutions). The effective index of the calculated TE mode is $n_e$~2.37 and a group index of $n_g$~4.3 at a wavelength of $\lambda$=1539 nm and temperature of 300 K.

The transmission through an add-drop ring resonator is expressed by $$T_t = \frac{r_2^2 a^2 - 2r_1 r_2 a \cos\theta + r_1^2}{1 - 2r_1 r_2 a \cos\theta + r_1 r_2 a^2} \quad (5)$$

for the through port, and $$T_d = \frac{(1-r_1^2)(1-r_2^2)a}{1 - 2r_1 r_2 a \cos\theta + r_1 r_2 a^2} \quad (6)$$

for the drop port. The parameters $r_1$ and $r_2$ are the coupling coefficients into and out of the ring, respectively, a is the self-coupling coefficient of the ring.

As is known, temperature modulation or control can be used to change the ring waveguide effective index $n_e$ and thereby shift the ring resonance wavelengths $\lambda_m$ as described by Equation (1). Accordingly, the inventors used temperature dependence to dynamically correlate the ring resonator output spectrum to the absorption lines. In particular, the temperature dependent net phase shift of the light in the ring resonator is described by $$\theta(T) = \frac{2\pi n_e(T)L}{\lambda}, \quad (7)$$

where $n_e(T)$ is the temperature dependent effective index. The spectral shift is described by $$\Delta\lambda_{TO} = \sigma_{TO}\lambda_0 \frac{\Delta T}{n_g}, \quad (8)$$

where $\sigma_{TO}$ is the thermo-optic coefficient of the mode $\lambda_0$ is the resonance wavelength and $\Delta T$ is the change in temperature. The resulting amplitude and relative phase of the integrated intensity can be used to identify and quantify the gas in the incident beam path.

The output spectrum of the ring resonator with absorption due to gas presence is $$S_d(\lambda,T)=A(\lambda)\cdot T_d(\lambda,T), \quad (9)$$

where $A(\lambda)$ is the gas absorption spectrum and $T_d(\lambda, T)$ is the ring resonator drop port transmission spectrum. The correlation signal $C(\lambda, T)$ is measured using a photodetector with a signal that can be expressed by the integral $$C(T) = \int_{\lambda_1}^{\lambda_2} S_d(\lambda, T)d\lambda. \quad (10)$$

A suitable ideal ring length can be calculated from Equation (2) by solving for ring length given a target FSR that matches the line spacing of the target molecule. For example, from this simple calculation using a group index of 4.34 at $\lambda$=1535 nm and T=295 K, a ring length of ~705 μm for hydrogen cyanide was obtained.

FIG. 3 shows simulation results based on the design above. FIG. 3a shows a simulated maximum modulation amplitude with temperature as a function of ring length and bandpass filter width. Ring resonator transmission spectra as a function of temperature and wavelength are correlated with the HCN absorption spectrum using Equation (9). The spectral products at $S_d(\lambda, T)$ are then integrated using Equation (10) to produce the correlation signal The self-coupling and loss coefficients ($r_1$, $r_2$, and a) were set at 0.9. These calculations were repeated for spectral bandwidths $\Delta\lambda_b=\lambda_2-\lambda_1$ ranging from 0.75 nm to 6 nm. At a ring length of 705 μm (with bandpass filter widths of 1.5 nm and larger), the modulation amplitude reaches a maximum, in line with an original estimate of 705 μm using an FSR of 0.77 nm in Equation (2). As the bandpass filter width increases, the correlation amplitude around 705 μm increases. This arises from the simultaneous overlap of multiple ring resonances with multiple gas absorption lines and a corresponding higher sensitivity. Other ring lengths also display non-negligible correlation signal amplitudes and can be used for sensing, such as at 470 μm and 1060 μm, but these are smaller.

Figure 3A:
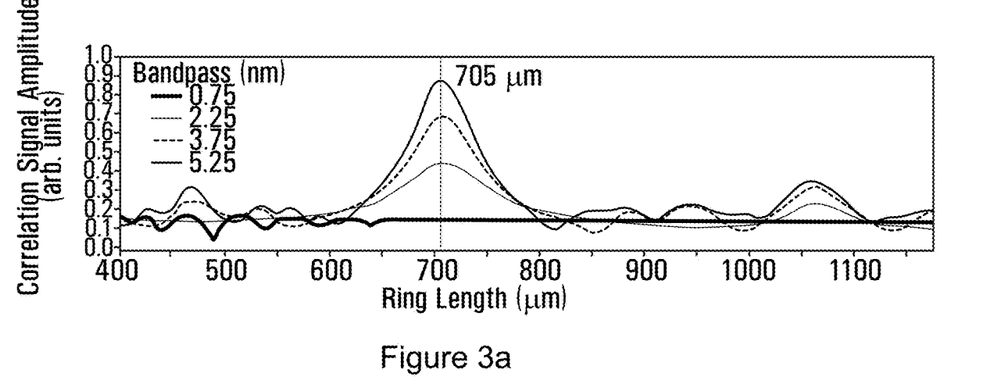
FIG. 3a shows a simulated maximum modulation amplitude with temperature as a function of ring length and bandpass filter width.

The HCN absorption spectrum A(A) was generated using line wavelengths and relative intensities from the high-resolution transmission molecular absorption database (HI-TRAN) and modeling them as overlapping approximated Voigt functions. The final absorption spectrum was created by subtracting the Voigt functions from a flat, normalized background.

Figure 3B:
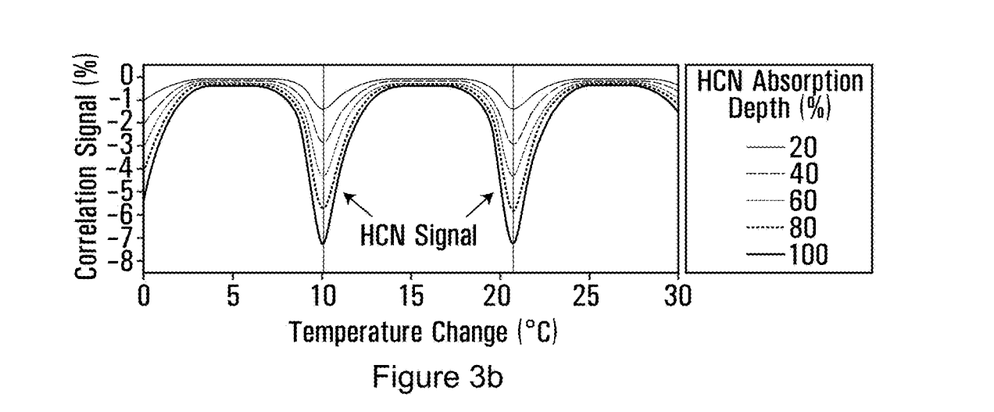
FIG. 3b shows the correlation signal as a function of temperature for various hydrogen cyanide absorption depths.
Figure 3C:
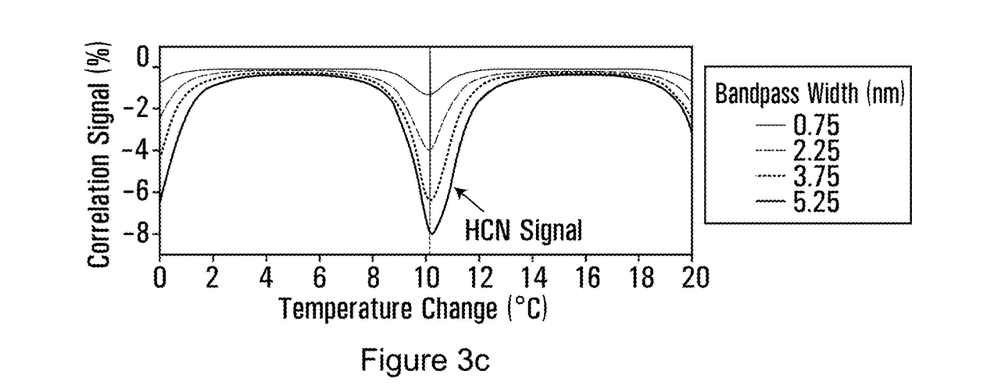
FIG. 3c shows the correlation signal plotted as a function of temperature for different bandpass widths.

With HCN absorption lines present, correlation signal dips are observed every 11° C., or approximately 0.77 nm in spectral shift of the ring resonance comb spectrum. In FIG. 3b, the correlation signal as a function of temperature is shown for various HCN absorption depths with a bandpass of 6 nm. A dip in the correlation signal becomes stronger as the deeper absorption lines from HCN increasingly block more light at the drop port of the ring resonator, showing that the sensor can distinguish relative HCN concentration in the beam column. With HCN producing a 100% absorption depth feature, the correlation signal changes by ~8% for the chosen ring resonator parameters a, $r_1$, $r_2$=0.9. The magnitude of the correlation signal change is also a function of the gas temperature and pressure. Intrinsic or Doppler broadened absorption lines lead to improved overlap between multiple resonances and generally leads to stronger correlation signals. The correlation also benefits from strong coupling in the ring, where broader resonances also lead to higher spectral overlap and increased absolute correlation signal change at the cost of relative signal change. We also investigated the effect of the bandpass filter width, which allows for more gas lines to contribute to the signal. The correlation signal is plotted as a function of temperature for different bandpass widths in FIG. 3c, showing greater signal amplitude with a larger bandpass. Increased specificity can be confirmed by observing the change in the correlation signal amplitude with increasing bandpass. The signal is also broadened due to imperfect overlap of the gas lines with the ring resonances. As the gas lines are asymmetrically distributed, a slightly asymmetrical shape to the correlation signal is visible at the large bandpass filter widths.

Figure 3D:
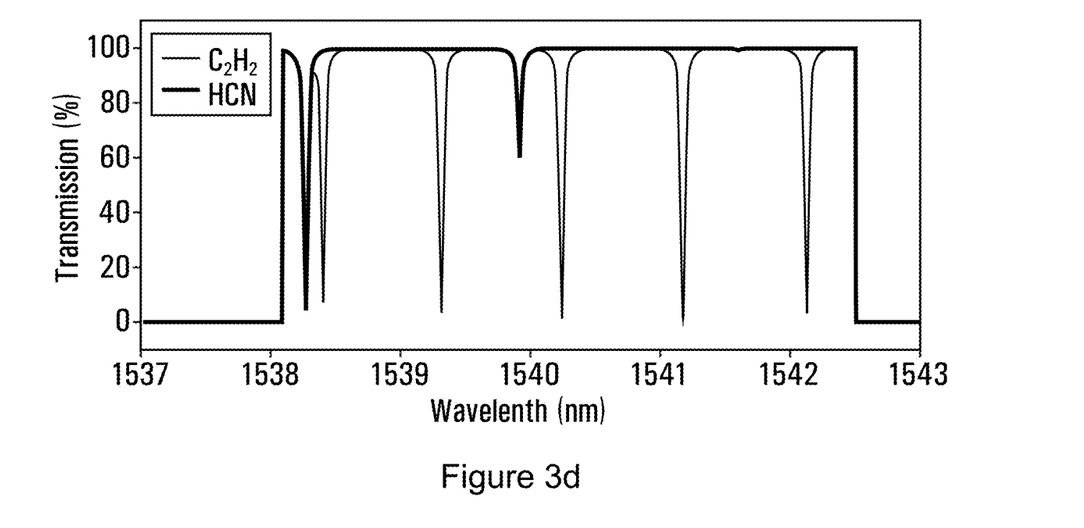
FIG. 3d shows the absorption spectrum where acetylene is present with HCN.
Figure 3E:
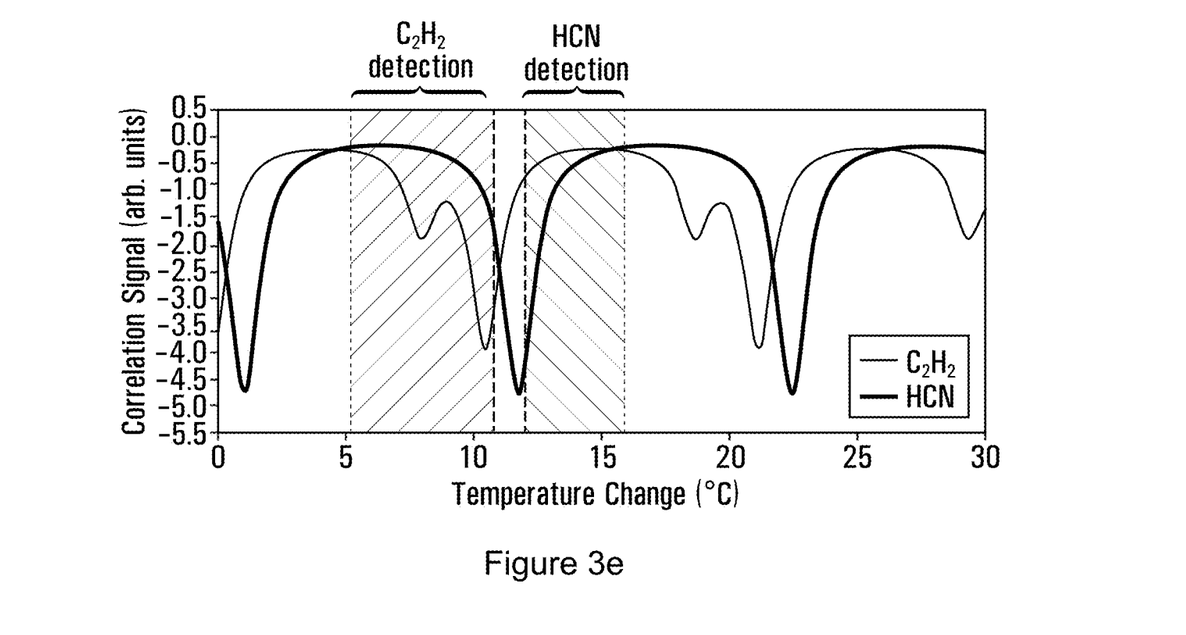
FIG. 3e shows the correlation signal at different temperatures.

The molecular specificity of the remote gas sensor is investigated since multiple gases can have absorption features in the bandpass. In the case of acetylene ($C_2H_2$) present with HCN, there are now two additional non-periodic strong absorption lines which complicate the spectrum, as shown in FIG. 3d. The correlation of the $C_2H_2$ spectrum with the ring resonator drop port transmission reveals a new correlation signal pattern. FIG. 3e shows that correlation features occur at different temperatures, one corresponding to $C_2H_2$, and the other to HCN. In this case, it is possible to judiciously choose a filter centre wavelength to ensure non-overlapping spectral features from different molecular species. The spectral features can include absorption features, emission features, features that are molecular in nature or features that are atomic in nature. The correlation features of $C_2H_2$ and HCN occur at unique ring temperatures, providing molecular specificity without acquiring a spectrum. The arrows in FIG. 3e indicate possible temperature modulation offsets such that the same sensor can independently detect either $C_2H_2$ or HCN. The inventors expect this molecular specificity feature to be upheld for other gases if the strongest absorption lines of both gases do not overlap. Additional specificity can be introduced by control over the bandpass filter width and centre wavelength, where different absorption features can end up inside or outside the bandpass.

Ring Resonator Fabrication

Silicon ring resonator devices were fabricated on the silicon-on-insulator (SOI) platform using E-beam lithography and reactive ion etching through Applied Nanotools. The ring resonator consists of a silicon waveguide formed into a racetrack loop. The invention is not limited to a racetrack loop or a ring loop, however. A spiral geometry is also possible which may help to reduce the footprint of the ring resonator on the silicon chip. The only requirement is that there is at least one closed continuous loop. It is also possible to have different rings/loops with different lengths for different gases. Each ring/loop would be designed for a particular gas to be detected. The rings/loops can be in series or in parallel configurations.

The silicon waveguide can comprise various waveguide configurations such as a slot waveguide, a strip loaded waveguide, a photonic crystal waveguide, a buried waveguide, an arrow waveguide, a ridge waveguide and a sub-wavelength grating waveguide.

Figure 4A:
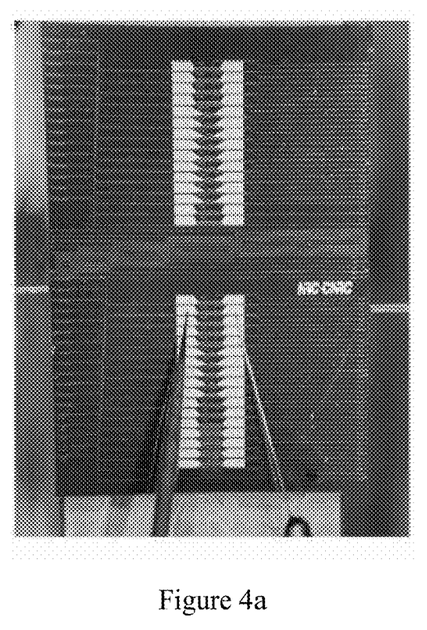
FIG. 4a shows the chip configuration of the silicon ring resonator.
Figure 4B:
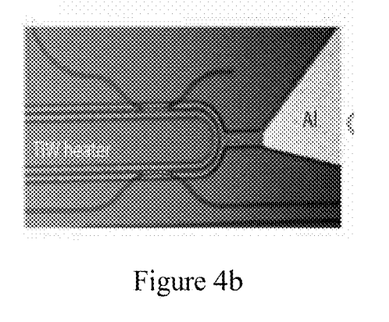
FIG. 4b shows an optical image of the silicon ring resonator.
Figure 4C:
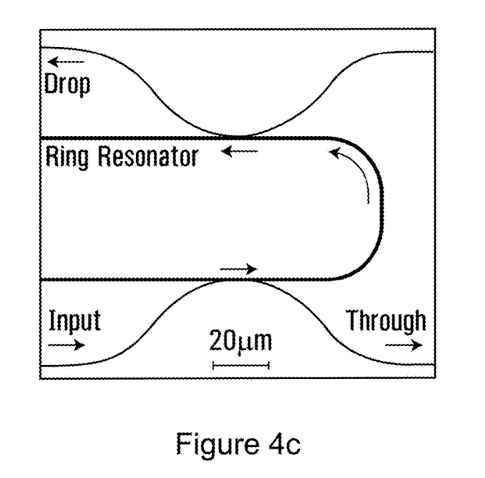
FIG. 4c shows a scanning electron micrograph of the silicon ring resonator.
Figure 5:
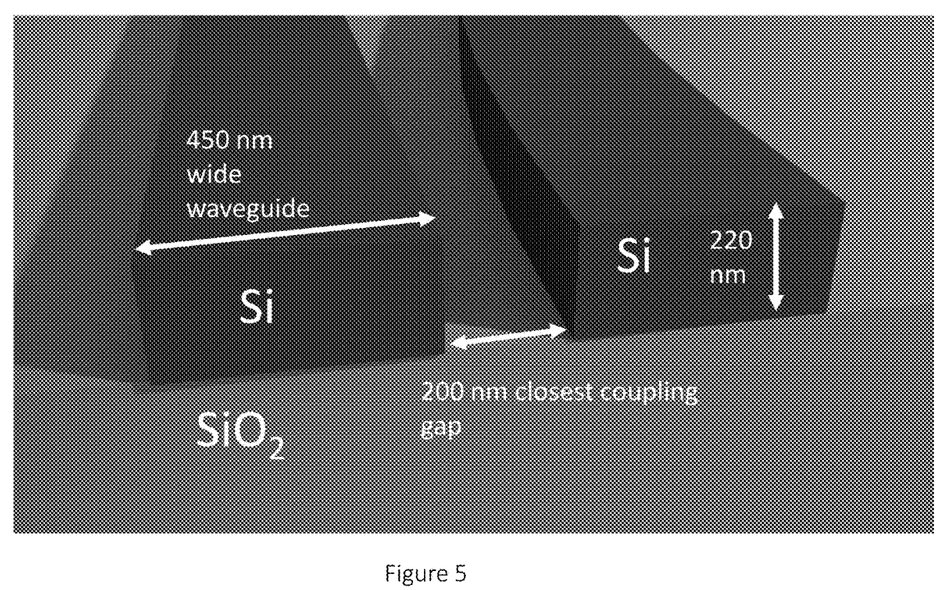
FIG. 5 shows a cross-section of the ring resonator showing the coupling region between the input waveguide and the ring waveguide.

The coupling and chip configuration is shown in FIG. 4a, with optical and scanning electron micrographs shown in FIGS. 4b and 4c, respectively. The buried oxide layer is 2 um thick with a 220 nm thick silicon layer. FIG. 5 shows a cross section of the input waveguide and the ring waveguide with the coupling gap between the two waveguides. Devices are fully etched to the buried oxide and have waveguide dimensions of 450 nm wide and 220 nm high. The waveguides are clad with a 2.2 um thick oxide layer. TiW microheaters are patterned atop the $SiO_2$ cladding to provide local heating to the waveguides. While patterned microheaters are described, other thermal active elements can also be used such as a temperature-controlled package in thermal contact with the chip. All heaters are covered in 300 nm of $SiO_2$ and provide a tuning rate of approximately 0.6° C./mA at low currents with a heater resistance of ~100Ω. The heaters are kept short due to the high resistivity of TiW and to support sufficient heating at low voltages. Light input and output are achieved through subwavelength edge couplers designed for adiabatic, low-loss broadband light coupling from a tapered fiber to the waveguide around 1550 nm. A deep trench etch is made through the entire chip to provide a smooth waveguide facet to couple input and output light. Devices are designed for TE polarization to increase the waveguide thermo-optic coefficient which is proportional to the mode overlap ratio between silicon and $SiO_2$. Coupling between the input waveguide and the racetrack ring resonator is accomplished using directional couplers with a closest coupling gap of 200 nm. The directional couplers were optimized with 5.4 μm and 6 μm parallel sections for the drop and through coupling sections, respectively. The asymmetric coupling length is designed to accommodate for some loss in the ring to better approach the critical coupling condition. The racetrack ring bend radii are fixed at 20 μm to ensure negligible bend losses. The propagation loss of the TE mode in the waveguides was approximately 1.3 dB/cm. A range of ring lengths were fabricated. A fabricated ring length of 737 μm led to the best overlap with the HCN lines. This length differs slightly from the simulated optimal length of 705 μm found in the previous section, likely due to differences between the fabricated and the designed waveguide geometry and material constants.

Another advantage of the present invention is that it is possible to tune how broad the resonance widths are by changing the coupling of the input waveguide to the ring waveguide and the ring waveguide to the add/drop waveguide. For example, by increasing the coupling length of the coupling regions 17 and 18 of FIG. 1, the coupling between the waveguides is stronger and the light has a greater chance of being coupled into or out of the ring waveguide. Similarly, if the coupling gap (as shown in FIG. 5) is narrowed, the coupling between the waveguides is stronger. Accordingly, by tuning the coupling length and the coupling gap, different types of ring resonator transmission profiles can be generated by using either a higher or a lower quality factor, Q and a low Q. Referring to Equation (4), if the resonance widths are increased, then the Q factor is decreased. A stronger coupling results in a lower Q factor. In many applications, a high Q factor with a low resonance width results in a very sharp filter. However, for the remote gas sensor described herein, a strong coupling and low Q factor is desired. A low Q factor results in broad resonance widths that have an increased chance of overlapping with the target gas absorption lines.

Figure 6:
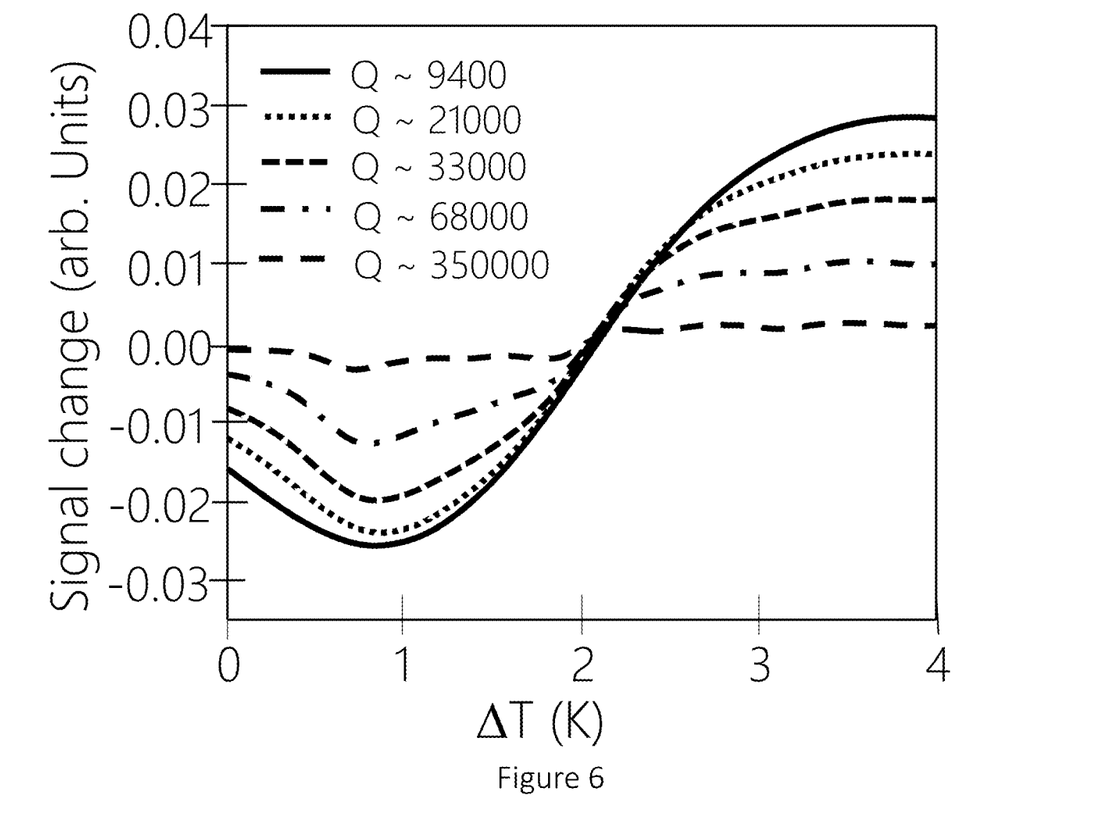
FIG. 6 shows the values of different quality factors as a function of temperature modulation.

FIG. 6 shows the values of different quality factors as a function of temperature modulation. The higher the quality factor, the weaker the coupling. As the quality factor decreases from the high quality factors to the lower quality factor, the temperature modulation improves and the stronger the contrasts in signal amplitude. For gas detection, temperature modulation can be from one degree to about four degrees (relative temperature change). Signal contrast could be achieved in three degrees of temperature modulation and gas detection could be easily achieved.

A key advantage in using a low quality factor is that design of the ring resonator is much simpler. The higher the Q factor, the higher the design tolerances are, leading to difficulty in the design. A low-loss ring resonator is not crucial to the operation of the present invention.

Experimental Demonstration Setup

Figure 4D:
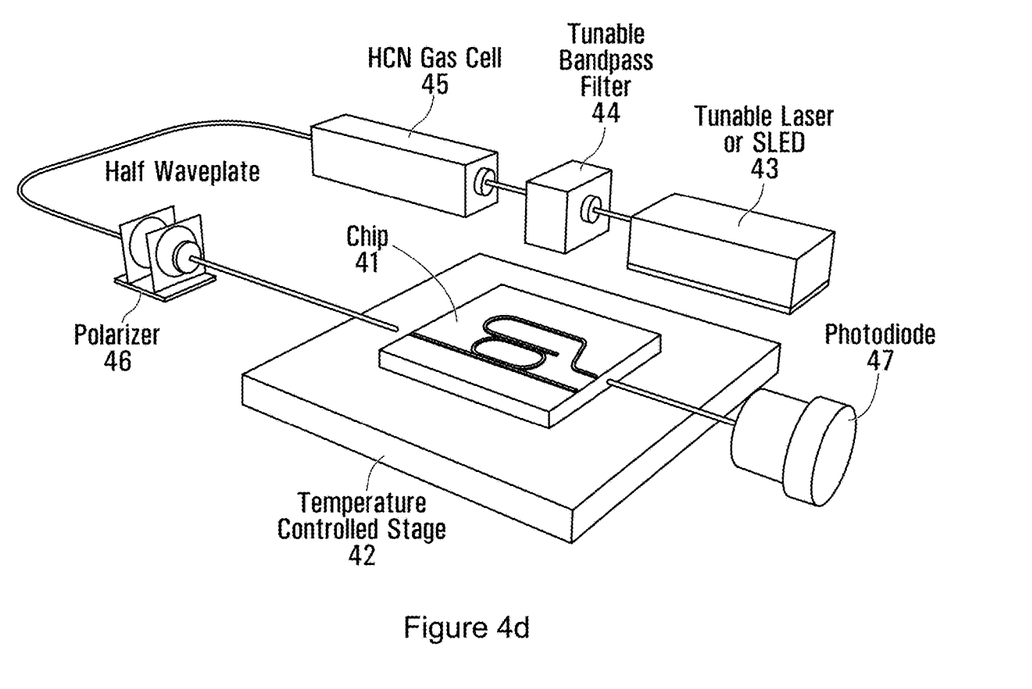
FIG. 4d illustrates an experimental optical characterization setup of remote gas sensor.

FIG. 4d is an illustration of the experimental optical characterization setup 40 of a remote gas sensor. The experimental setup 40 includes silicon ring resonator chip 41, temperature-controlled copper stage 42, light source 43, tunable bandpass filter 44, gas cell 45, polarization controller 46 and photodetector 47.

The silicon ring resonator chip 41, comprising the ring resonator, input and output waveguides and microheaters (not shown), was placed on the temperature-controlled copper stage 42 and maintained at 20° C. The temperature of the stage 42 is held constant while varying the current through the microheaters on the chip (not shown) to modulate the drop port output spectrum. Tapered polarization maintaining fibers are used for light input and output coupling. The contact pads of the microheater were contacted with needle probes connected to a current source. The invention is not limited to a current driven microheater. A voltage driven microheater or any method of actively modulating the ring waveguide effective index $n_e$ could also be used.

The light source 43 comprises a tunable laser source or a broadband superluminescent diode system centered at 1555 nm.

The input light from the light source 43 is passed through the tunable bandpass filter 44 which supports tuning of the center wavelength and spectral width of the bandpass. The bandpass filter can have a tunable bandwidth. The bandpass filter can also have a tunable center bandwidth. The bandpass filter can be integrated on-chip or can be a bulk optical element.

The light is then passed through gas cell 45, which in this case is an HCN gas cell, but could be any form of gas sample depending on the application.

The light polarization is controlled using polarization controller 46 that was adjusted to couple only TE polarized light to the chip 41. In the present setup, a half waveplate was used as the polarization controller 46.

The transmission spectra of the ring resonator and the gas cell 45 were acquired using photodetector 47. In this configuration, the photodetector 47 measures the total light power exiting the drop port of the ring resonator. This configuration uses an incoherent source, and enables real-time hardware correlation, therefore better representing the actual operating characteristics of the remote gas sensor. The photodetector 47 can comprise a photodiode. The photodetector 47 can comprise a single channel element or an array of detection elements.

Figure 7A:
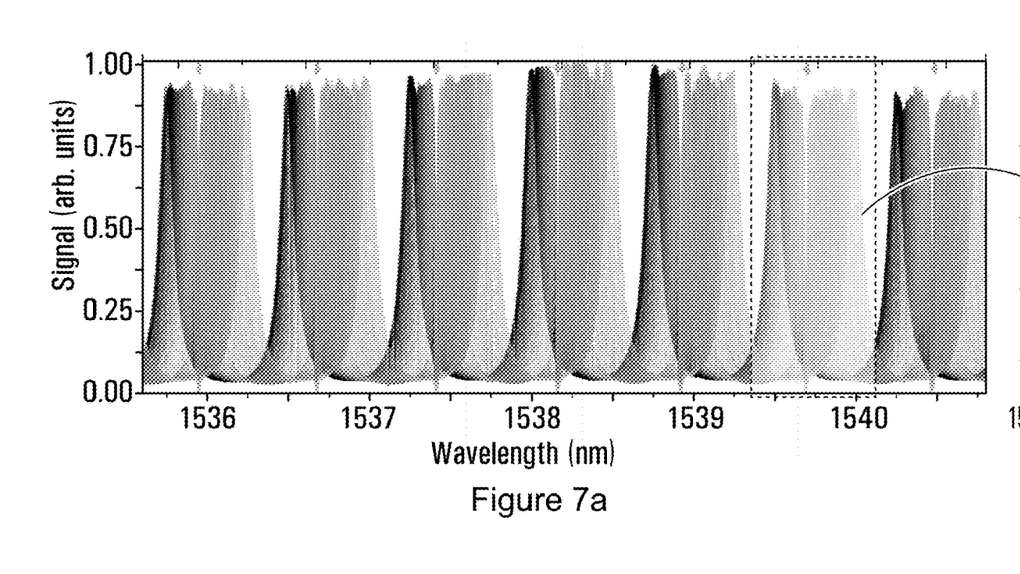
FIGS. 7a and 7b show the drop port transmission spectrum of the ring resonator redshifted by increasing the current through the microheater.

The racetrack ring resonators shown via microscopy in FIGS. 4a,b,c were first characterized with 1 mW laser light from 1534 nm to 1543 nm at the through and drop ports with 1 mW using the tunable laser as the light source 43 and using the experimental configuration shown in FIG. 4d. The transmission characteristics of the drop port for a 737 µm long ring are shown in FIG. 7a. While the correlation technique can be applied either using the through or drop ports, the drop port signal provides a higher signal to background ratio since the integrated power is less susceptible to interference and other spurious effects across the chip and measurement system.

The apparatus as described by the illustrations of the embodiments of the invention is not intended to represent every possible embodiment of the invention, nor intended to limit the invention to exact descriptions of specific embodiments that are used for exemplifying purposes. Variations of the sensor within the limits of the invention are possible and discernable by those skilled in the art.

Temperature Dependent Transmission Spectrum

Figure 7B:
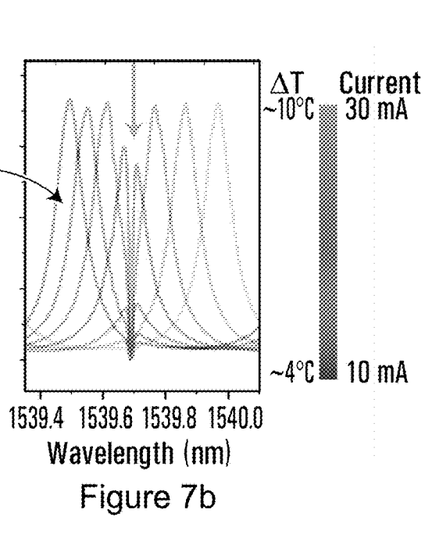

With the HCN gas cell inserted into the light path, absorption features are overlaid upon the drop port transmission spectrum of the ring resonator. The drop port transmission spectrum is redshifted by increasing the current through the microheater as shown in FIGS. 7a and 7b. The resonances shift by the full FSR of the ring approximately every 11° C., or a spectral shift of about 70 µm/° C. The temperature dependent transmission spectrum of a single drop port resonance mode as it crosses a single HCN absorption line at 1539.7 nm is shown in FIG. 7b. At a microheater current of around 15-18 mA, the ring is heated to ~6° C. above the stage temperature and the resonances are aligned with the HCN absorption lines. The narrow widths the HCN lines leave sharp drops in transmitted power at known wavelengths. The transmitted power over each ring resonance drops by roughly 8% with the HCN gas cell in place. The relative drop in optical power is dependent on the pressure, temperature, absorption depth of the gas lines, as well as the ring resonator coupling and loss parameters. In this case, the ring resonator was designed with a low quality factor to allow for the overlap of multiple gas lines simultaneously.

Figure 7C:
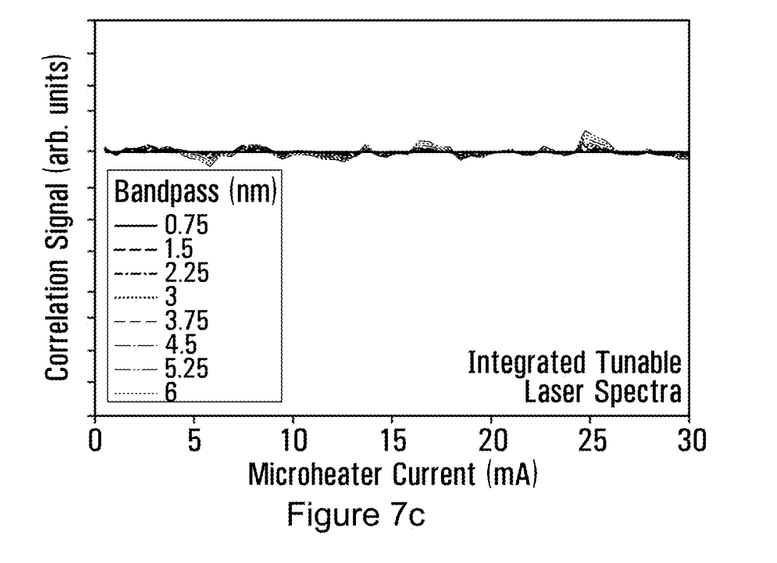
FIG. 7c shows the absorption spectrum as a function of current of the ring resonator only.
Figure 7D:
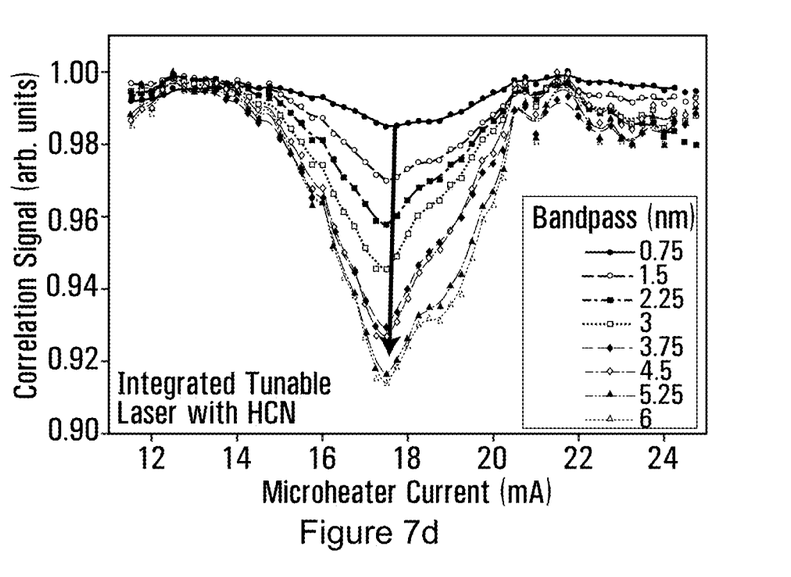
FIG. 7d shows the absorption spectrum with HCN present.

To emulate operation using background broadband illumination, the tunable laser transmission spectra through the ring drop port is integrated, as in Equation (10), across the desired passband where the gas lines are strongest and best match the drop port resonances. The measurements were repeated when the gas cell 45 was removed, providing a reference spectrum representing the background system throughput as a function of microheater current. The correlation signals without the gas cell 45 (ring resonator only) are normalized for direct comparison at bandpass values from 0.75 nm to 6 nm, corresponding from 1 to 8 HCN lines, shown in FIG. 7c. The flat correlation signal indicates the lack of HCN present since the integrated intensity over the passband remains constant and unaffected by the HCN absorption lines In this case, the spectral bandpass is implemented in the post-processing of the data by precisely truncating the integration of the spectrum to ensure the resonance entering the bandpass is exactly balanced by another exiting the bandpass. The spectra acquired with HCN present are integrated over an optimized bandpass that is approximately a multiple of the ring resonator FSR. With increasing bandpass widths, the correlation feature at ~18 mA is more apparent and becomes broader, as is evident from FIG. 7d. The contributions from multiple ring resonances overlapping with multiple gas lines leads to an improvement in detectivity. The broadening of the correlation signal minimum is a result of the mismatch in aperiodicity of the gas lines and the ring resonances. An additional feature is visible at 19 mA from the limiting overlap of the absorption lines that is also noticeable in the simulation result of FIG. 3c.

Remote Gas Detection with a Weak Broadband Background

Figure 7E:
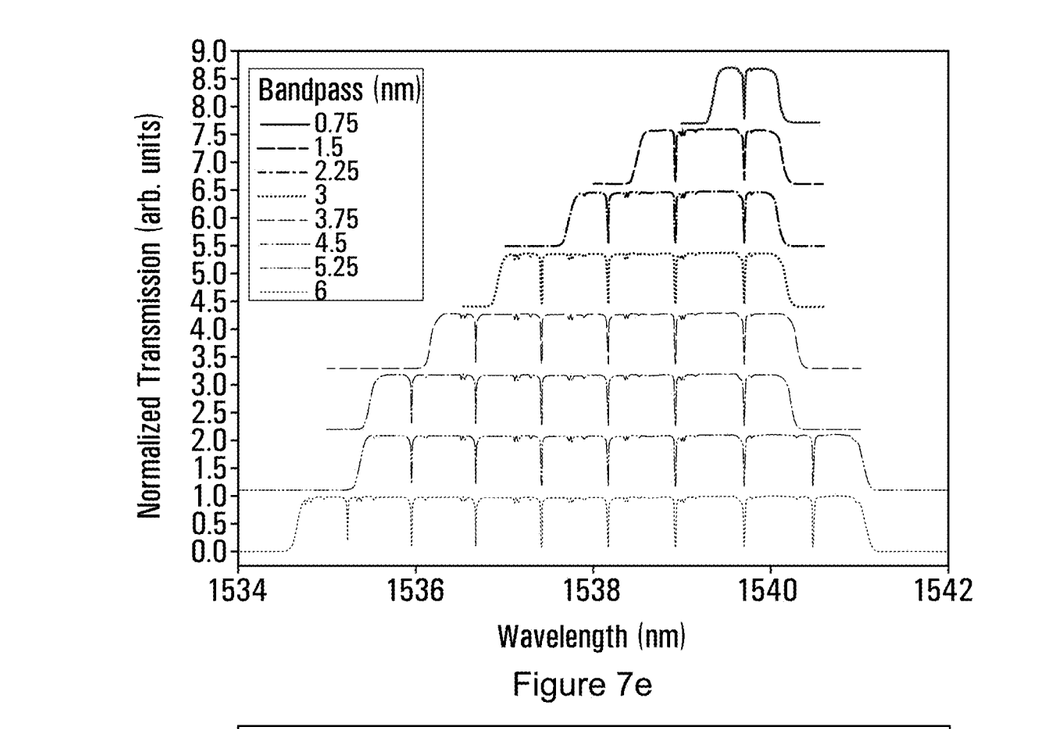
FIG. 7e shows the normalized transmission spectrum through the filter and the gas cell for varying bandpass widths.
Figure 7F:
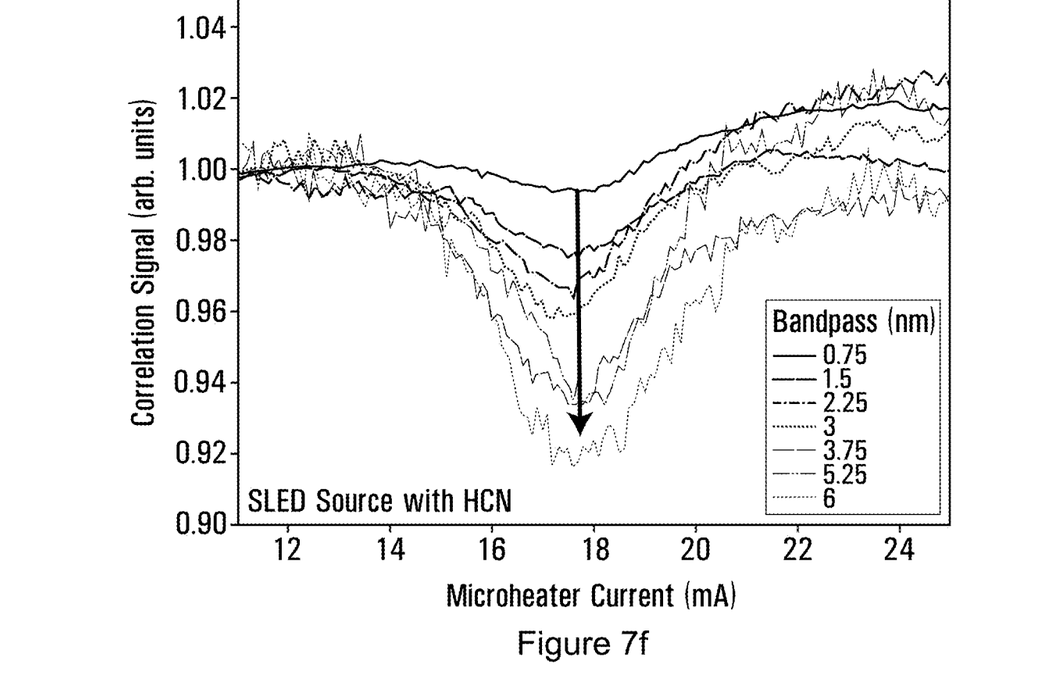
FIG. 7f shows the correlation signal with and without the gas cell in the light path.

Sensing using a weak broadband background by the changing the light source 43 of FIG. 4d to a superluminescent LED is described. The spectral power density detected at the photodiode is around 30 pW/nm, or on the order of >200,000 weaker than the tunable laser. This source better represents a dim target typically encountered in astronomical observations, for example. Different bandpass widths and centre wavelengths were selected using the tunable bandwidth filter to accommodate 1 to 8 gas lines. The normalized transmission spectra through the filter and the gas cell 45 for varying bandpass widths are measured using a tunable laser sweep and are shown in FIG. 7e. The microheater current is increased from 11 mA to 25 mA as before, allowing the resonances to simultaneously align with the gas lines. The power at the photodiode, which inherently integrates the output spectrum, is measured as a function of microheater current with a fixed stage temperature. The correlation signal without the gas cell connected is not constant due to the residual interaction of the ring transmission spectrum with the bandpass filter shape width used. Therefore, the difference between the correlation signal with and without the gas cell in the light path is shown in FIG. 7f. As in this case, the subtraction of the reference correlation signal from the measured signal can be used as a calibration technique. When the HCN gas cell is connected, a clear dip by about 8% in the correlation signal is seen centred at ~17-18 mA of microheater current, similar to what is seen by integrating the tunable laser spectra. The signal-to-noise ratio is significantly lower when using the SLED source due to its much weaker spectral power density, as well as from additional insertion losses from the tunable bandpass filter. When the ring resonances are misaligned with respect to the absorption lines of HCN (below 14 mA and above 22 mA), the output power is at the nominal value corresponding to no gas detection. The correlation signal is similarly broadened and deeper as the bandpass filter width is increased. The overlap of multiple absorption lines is inferred from a decrease in the signal with increasing bandpass filter widths. At wider bandpass filter widths, simultaneous overlap of all ring resonances and gas lines in the bandpass is not possible, and partial overlaps occurs. This effect broadens the signal and results in a limit to the sensitivity when using nearly equally spaced ring resonances.

CONCLUDING REMARKS

An integrated photonic remote gas sensor has been described based on spectrum-free detection and identification of absorption features of a gas contained within a broadband background light. By engineering a silicon waveguide ring resonator with appropriate length and group index, a correlation filter can be matched to gases with quasi-periodic absorption features over a bandpass of a few nanometres. It has been shown that the overlap of the ring resonator drop port with the absorption lines of HCN produces a unique modulation pattern that identifies HCN based on the phase of the modulated correlation signal. HCN detection with a weak broadband source has been additionally demonstrated. While demonstrated with HCN, many other gases with similar periodic absorption features such as $CO_2$ and CO can be detected similarly with different ring lengths. We also show by simulation that the sensor can operate in the presence of $C_2H_2$ and should distinguish other gases with non-overlapping absorption features in the same bandpass.

The inventors have shown that ring resonators have been used as a convenient device to generate a quasi-periodic comb filter. However, it also possible to create much more complex waveguide filters based on gratings to precisely match more complex gas spectra over wider spectral ranges, for example using layer peeling methods for Bragg gratings on the silicon nitride platform. The precise matching of filter transmission to gas spectra should further increase the specificity and signal-to-noise ratio of the correlation method. This correlation technique reduces the detection requirement from a 1D photodetector array of typical dispersive spectrometer to a single channel, which introduces cost and sensitivity advantages while maintaining molecular specificity of full spectrum acquisitions. In extremely low signal applications, avalanche photodiodes or photomultiplier tubes can be used. The multiplexed advantage of a single channel for gas sensing can also pave the way towards a form of gas mapping where arrays of ring resonators can process light from individual pixels.

What is claimed is:

1. An apparatus, comprising:
    an optical waveguide ring resonator having a waveguide width and height; a well-defined round-trip length that results in a free spectral range matching spacing of spectral features of a remote target over a defined bandpass;
    a bandpass filter;
    a background light source;
    a singular or plurality of optical bus waveguides evanescently coupled to the ring resonator;
    input and output optical channels;
    an active element which can reversibly tune the effective index of the ring resonator; and
    a photodetector.

2. The apparatus as in claim 1, wherein the input and output channels comprise at least one of single mode waveguides, single mode optical fibers, focusing and/or collimating objectives, or surface grating couplers or optical antennae.

3. The apparatus as in claim 1, wherein the spectral features are absorption features, emission features, molecular in nature or atomic in nature.

4. The apparatus as in claim 1, wherein the input light into the ring resonator is polarized to the TE polarization or to the TM polarization.

5. The apparatus as in claim 1, wherein the input light is divided by polarization and input into two ring separate ring resonators.

6. The apparatus as in claim 1, wherein the ring resonator transmission spectrum matches one of more spectral features of a single gas or multiple gases.

7. The apparatus as in claim 1, wherein the ring resonator is in an add-drop configuration.

8. The apparatus as in claim 1, wherein the output light is measured from a drop port of a ring resonator or a through-port of a ring resonator.

9. The apparatus as in claim 1, wherein the ring resonator is in a racetrack geometry, a spiral geometry, a circular geometry, or an arbitrary closed loop geometry.

10. The apparatus as in claim 1, wherein the ring resonator is a multitude of ring resonators in series or parallel.

11. The apparatus as in claim 1, wherein the waveguide of the ring resonator is a slot waveguide, subwavelength grating waveguide, a strip loaded waveguide, a photonic crystal waveguide, a buried waveguide, an arrow waveguide, a ridge waveguide.

12. The apparatus as in claim 1, wherein the output signal is measured using a lock-in amplifier.

13. The apparatus as in claim 1, wherein the photodetector comprises a single channel element or an array of detection elements.

14. The apparatus as in claim 1, wherein the evanescently coupled optical bus and ring waveguides are directional couplers or multimode interference couplers.

15. The apparatus as in claim 1, wherein the active element comprises: a patterned microheater with a current source or a voltage source; a temperature-controlled package in thermal contact with the chip; a semiconductor junction for charge injection or an electric field modulator.

16. The apparatus as in claim 1, wherein the bandpass filter has a tunable bandwidth or a tunable center bandwidth.

17. The apparatus as in claim 1, wherein the bandpass filter is integrated on-chip or is a bulk optical element.

18. A method, comprising providing the ring resonator of the apparatus of claim 1 with a free spectral range that matches a spectral feature spacing of a remote gas target over a defined bandpass.

19. A gas sensor for the detection of a target gas located remotely from the gas sensor and between a light source and the gas sensor, the target gas having a target gas absorption spectrum, comprising:
    a loop resonator comprising an input for receiving an input signal and an output for outputting an output signal having an output signal transmission spectrum, wherein a transmission spectrum of the input signal includes the gas absorption spectrum, the loop resonator having at least one length dependent on a characteristic of the target gas absorption spectrum; and
    a heating element providing an adjustable range of current to the loop resonator, wherein temperature modulation of the loop resonator causes a spectral shift of resonances in the output signal transmission spectrum permitting tuning of the loop resonator to match at least one spectral feature of the target gas absorption spectrum.

* * * * *